(12) United States Patent
Lee et al.

(10) Patent No.: US 7,683,475 B2
(45) Date of Patent: Mar. 23, 2010

(54) LED CHIP ARRAY MODULE

(75) Inventors: Ho-Shang Lee, El Sobrante, CA (US);
Jun-Ying Lu, Castro Valley, CA (US)

(73) Assignee: Dicon Fiberoptics, Inc., Richmond, CA (US)

( * ) Notice: Subject to any disclaimer, the term of this patent is extended or adjusted under 35 U.S.C. 154(b) by 563 days.

(21) Appl. No.: 11/394,781

(22) Filed: Mar. 31, 2006

(65) Prior Publication Data

US 2007/0235863 A1    Oct. 11, 2007

(51) Int. Cl.
*H01L 23/34* (2006.01)

(52) U.S. Cl. ............... 257/723; 257/678; 257/E33.056; 257/E33.055; 257/98

(58) Field of Classification Search .................. 257/81, 257/82, 91, 98, 99, 100, 116, 117, 432–437, 257/720–749, E33.056–E33.059, E25.32
See application file for complete search history.

(56) References Cited

U.S. PATENT DOCUMENTS

| | | | |
|---|---|---|---|
| D490,387 S | 5/2004 | Yagi | |
| 6,828,597 B2 | 12/2004 | Wegleiter et al. | |
| 6,860,621 B2 | 3/2005 | Bachl et al. | |
| 6,869,812 B1 * | 3/2005 | Liu | 438/22 |
| 2004/0070338 A1 * | 4/2004 | Noguchi et al. | 313/512 |
| 2006/0163590 A1 * | 7/2006 | Erchak et al. | 257/88 |

\* cited by examiner

*Primary Examiner*—Fernando L Toledo
*Assistant Examiner*—Mamadou Diallo
(74) *Attorney, Agent, or Firm*—Davis Wright Tremaine LLP

(57) ABSTRACT

The difficulties encountered in conventional LED multiple chip modules where wire bonding is used to connect the chips to electrodes can be overcome by using an interconnect to connect the chip to electrodes in a module where the interconnect is supported at points along its length other than at endpoints thereof, by a carrier either directly or indirectly. This improves reliability of the interconnect over conventional designs. Preferably, the contacts of the chips, and the electrodes are all within, or do not extend beyond, two parallel planes that are 400 microns apart for a compact design.

11 Claims, 13 Drawing Sheets

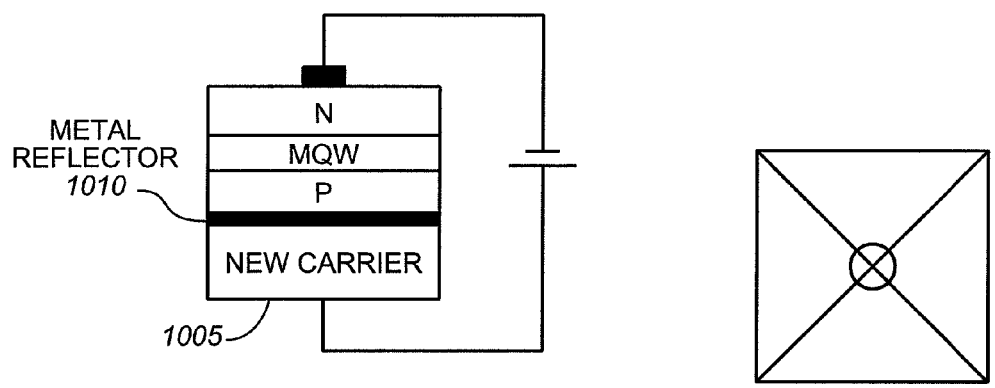
FIG. 10E
*(PRIOR ART)*
FIG. 10F
*(PRIOR ART)*
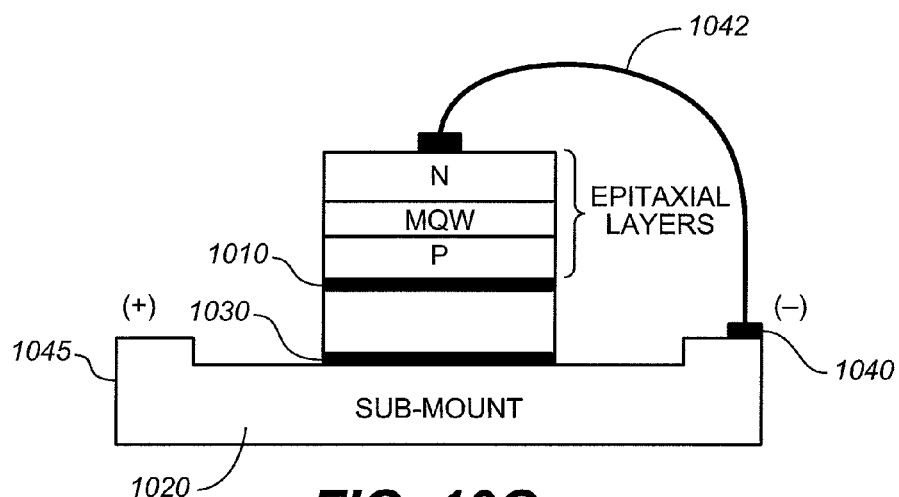
FIG. 10G
*(PRIOR ART)*

US 7,683,475 B2

LED CHIP ARRAY MODULE

BACKGROUND OF THE INVENTION

Rapid advances in high-brightness (HB) Light Emitting Diode (LED) technology in the last 10 years have opened up the possibility of using HB-LEDs as sources of general illumination. From 1995 through 2004, the HB-LED exhibited a remarkable growth history, with an average annual growth rate of 46% to a market size of $3.7 billion in 2004. Remarkable progress of LED in external quantum efficiency, lumen output and long lifetime has initiated a market in niche lighting applications. It is believed that LEDs can have a significant share of the general lighting market in the next 10 years.

The current disadvantages of LEDs compared to conventional light sources are their much higher cost and lower lumen output per device. For increasing lumen output, high-density assembly of multiple chips in a compact module is becoming the trend. In a multi-chip assembly, the output color can also be changed dynamically as needed. As the number of chips in an array increases, interconnections among chips become very difficult and suffer from reliability. Wire bonds from chip to chip or from chip to electrical contact are typically used for interconnection. However, limited space for wiring and wire protrusion are a big challenge. The present invention introduces a means to interconnect all chips all at once without using bond wires.

SUMMARY OF THE INVENTION

The above difficulties encountered in conventional LED multiple chip modules can be overcome by using an interconnect to connect the chips to electrodes in a module where the interconnect is supported at points along its length other than at endpoints thereof, by a carrier either directly or indirectly. This improves reliability of the interconnect over conventional designs. Preferably, the contacts of the chips, and the electrodes are all within, or do not extend beyond, two parallel planes that are 400 microns apart. This results in a much more compact module than conventional designs. While preferably the entire length of the interconnect is supported by the carrier, the electrodes or the chip contacts, this is not required, so that it is possible for portions of the interconnect not to be so supported. As long as parts of the interconnect are so supported, reliability of the electrical connections will be much improved over conventional designs, where each bonding wire is supported only at its two ends.

In one embodiment, the three elements (i.e. the interconnect, electrical contacts of the chips, and the electrodes) are supported by a surface of a carrier, so that one or more of the elements are supported on the surface either directly, or indirectly through one of the other elements. Where the elements are not thick, they will all be within, or do not extend beyond, two parallel planes that are 400 microns apart.

In another embodiment, the interconnect, the contacts of the chips, and the electrodes are supported by the supporting surfaces of different carriers, such as two different carriers, where the supporting surfaces (whether or not parallel) of the carriers are close together so that they are not more than 400 microns apart. In this manner, the interconnect, the contacts of the chips, and the electrodes are all within, or do not extend beyond, two parallel planes that are 400 microns apart.

By using the above described interconnecting structures, use of bond wires is avoided, so that the module is much easier to make, and the electrical connections are more reliable than conventional ones. Techniques used in semiconductor processing may be used in making the interconnect.

BRIEF DESCRIPTION OF THE DRAWINGS

FIG. 10A is a partly side view and partly schematic view of the structure of a conventional GaAs-based LED.

FIG. 10B is a top view of the LED of FIG. 10A.

FIG. 10E is a partly side view and partly schematic view of the structure of the conventional GaAs-based LED of FIGS. 10A and 10B, where the substrate of the LED has been replaced by a new carrier, so that its N and P claddings are flipped over with respect the new carrier.

FIG. 10F is a top view of the LED of FIG. 10E.

FIG. 10G is a partly side view and partly schematic view of the conventional GaAs-based LED of FIGS. 10E and 10F, where the LED chip is mounted onto a sub-mount and wire bonding used to interconnect the chip and an electrode on the sub-mount to illustrate a wire bonding technique used in conventional chip arrays.

DESCRIPTION OF EXEMPLARY EMBODIMENTS

Since their inception in the early 1960's, light emitting diodes have gained widespread use and now can be found nearly everywhere. The devices are fabricated by depositing a stack of epitaxial layers onto a substrate. Normally the deposition starts from electron-excessive layers called n-doped layers, then Multiple Quantum Wells (MQWs) and at last the p-doped layers having holes. When a potential is applied across the device, the electrons and holes move in the opposite directions and combine in the MQWs. This causes light to be emitted with a wavelength and color determined by the energy released when the electrons and holes combine.

Figure 10A:
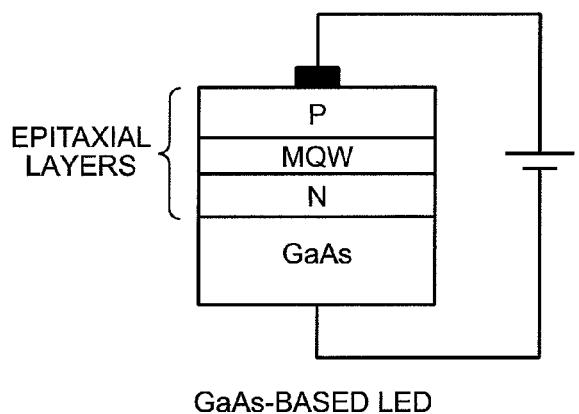
FIGS. 10A and 10B illustrate conventional LED dies (or chips) for GaAs-based (color ranging from red to yellow) and GaN-based (color ranging from Green to blue) LED devices, respectively.
Figure 10B:
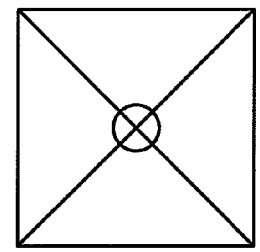
Figure 10C:
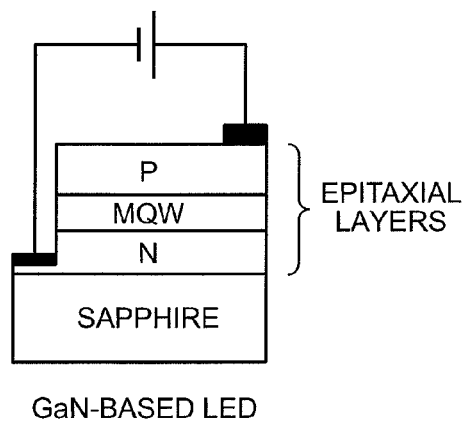
FIG. 10C is a partly side view and partly schematic view of the structure of a conventional GaN-based LED using sapphire as substrate.
Figure 10D:
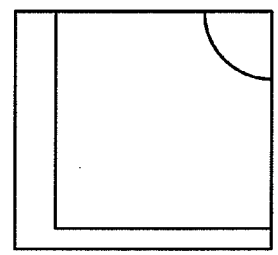
FIG. 10D is a top view of the LED of FIG. 10C.

FIGS. 10A and 10C illustrate conventional LED dies (or chips) for GaAs-based (color ranging from red to yellow) and GaN-based (color ranging from green to blue) LED devices, respectively. Epitaxial layers are grown onto a wafer of GaAs, SiC or sapphire. GaAs or SiC are electrically conductive and therefore their arrangement of electrode is indicated by FIG. 10A. Sapphire is non-conductive and therefore a side-wall etching down into the n-doped layers is necessary to make a cathode electrode as shown in FIG. 10-C.

To obtain high optical extraction from the die, a wafer-bonding technique used in semiconductor industry may be implemented. In this technique, a new carrier with better electrical and thermal conductivity is used to replace the original substrate. Wet etching is used to remove the GaAs-based substrate in FIG. 10A. Instead, laser lift-off is used to remove the sapphire in FIG. 10C. Before bonding the new carrier 1005 to the epitaxial structure derived from the structure of FIG. 10A, a stack of thin metal layers 1010 as a reflector and current spreading layer is coated on the surface of the p-doped layer as illustrated in FIGS. 10E and 10F. The detailed wafer bonding technique is introduced in U.S. Pat. No. 6,828,597, which is incorporated herein by reference.

Conventionally, the wafer-bond LED die is then attached to a sub-mount 1020 by conductive material such as silver epoxy or solder 1030 as shown in FIG. 10G. The p-doped layer is therefore electrically connected to an anode electrode 1045 through the sub-mount 1020. The n-doped layer being on the top of the die is then electrically connected through a thin metal wire 1042 to the cathode electrode 1040, which is electrically insulated from the sub-mount 1020.

Figure 1A:
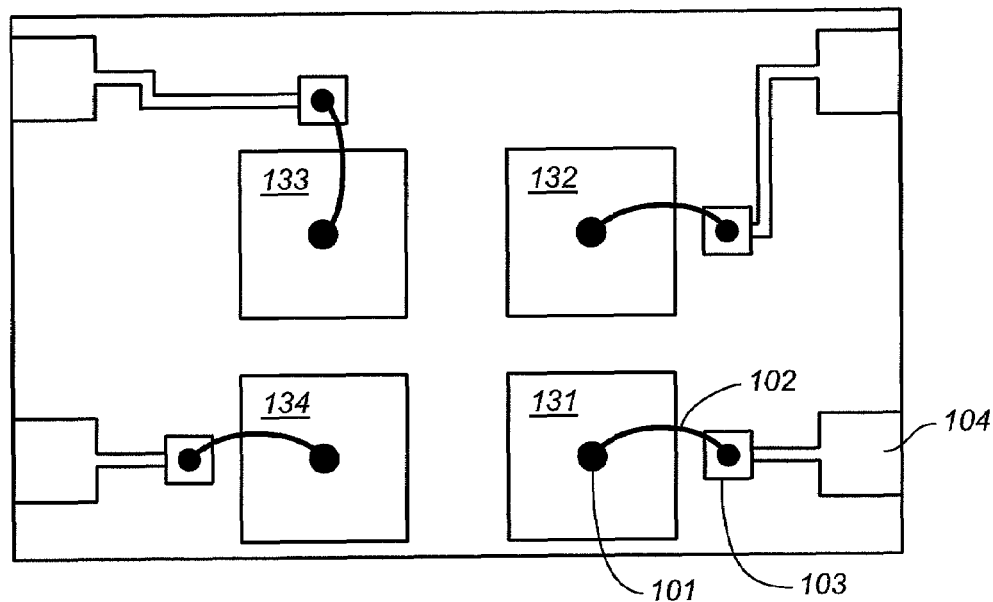
FIG. 1A is a top view of a conventional assembly of LED chip array.
Figure 1B:
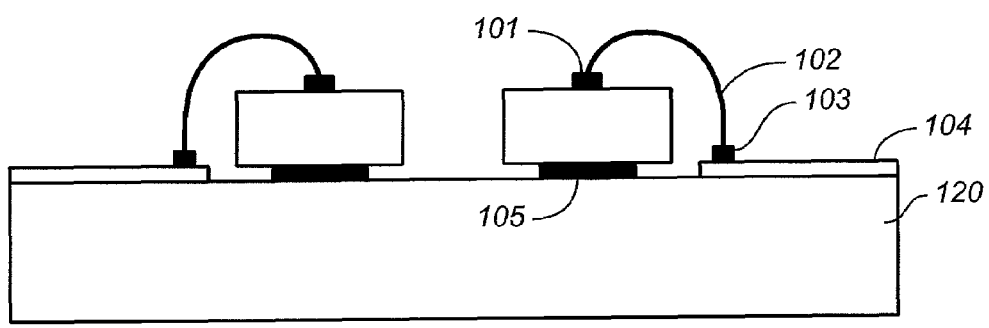
FIG. 1B is a side view of the conventional assembly of FIG. 1A to illustrate the chip bonding in such assembly.

As high lumen output is required for certain high density illumination such as light engine for projects and TFT-LCD displays, a multiplicity of LED chips are placed in proximity in recesses in a sub-mount 120 to meet the requirement. As illustrated in FIG. 1A, LED chips 131-134 are placed onto bond pads 105 located in recesses of the sub-mount 120. Only two of four metal pads are visible in FIG. 1B, which is a side view of the LED chips and sub-mount assembly of FIG. 1A. Conductive silver epoxy may be pre-applied to bond pads 105 before the LED chips 131-134 are placed into the recesses in sub-mount 120. After the LED chips 131-134 are placed into the recesses and on top of the silver epoxy which lies on top of the bond pads 105, the LED chips and sub-mount assembly is heated up to cure the silver epoxy so as to secure LED chips in place in sub-mount 120. A metal wire 102 is then connected to the bond pad or contact 101 on LED chip 131 at one end and to another bond pad 103 located on and in electrical contact with an electrode 104, to electrically connect chip 131 to electrode 103. U.S. Pat. Nos. 6,860,621 and D490,387 are cited to illustrate the wire bonding scheme which may be used in this process. As illustrated in FIG. 1B, the bond wires 102 protrude upwards from contact 101 and electrode 103, as well as from corresponding contacts and electrodes for other LED chips in the same assembly.

As the number of chips on the sub-mount 120 increases, the wire bonding becomes more difficult and time consuming and the reliability is at risk due to the protrusion of bond wires out of the sub-mount. It is therefore desirable to provide an LED multiple chip module where such difficulties are avoided. The present invention eliminates the wire bonding process, and achieves an interconnect configuration where the chip contacts, the electrodes and the electrical interconnections between them all confined within a thin slice of space, such as the space bounded by two imaginary parallel planes not more than 400 microns apart.

In-one embodiment of the invention, the interconnect configuration is such that the interconnections are substantially in the plane of the chip surfaces or in a plane slightly above or below the chip surfaces, as explained in more detail below in reference to FIGS. 2A-7B.

Figure 2A:
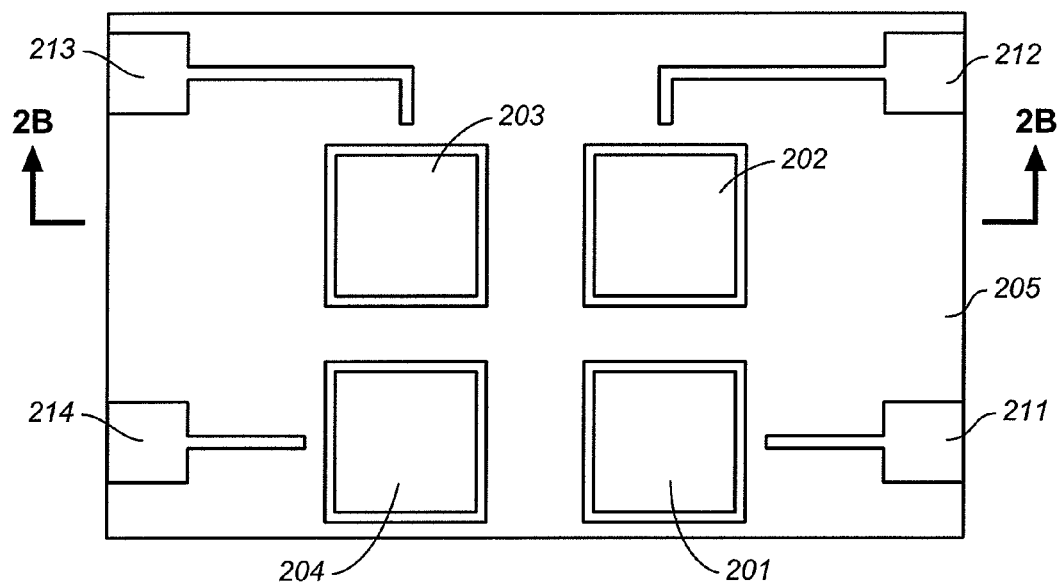
FIG. 2A is a top view of a sub-mount for LED chips useful for illustrating an embodiment of the invention.
Figure 2B:
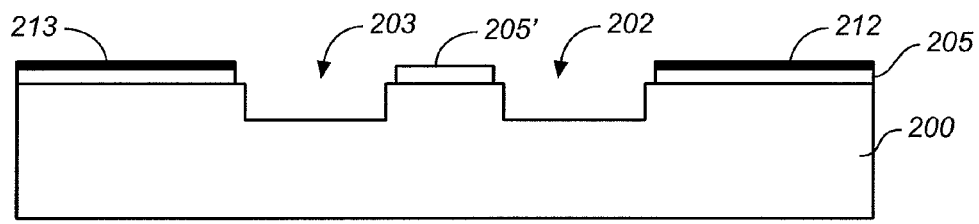
FIG. 2B is a cross-sectional view of the sub-mount for LED chips of FIG. 2A along the line 2B-2B in FIG. 2A.

The LED chips and sub-mount is formed in the following process to form a structure illustrated in FIGS. 2A and 2B. At first a thin electrically insulating layer or insulator 205 such as silica is coated on the surface of a sub-mount 200 as shown in FIG. 2A. The sub-mount 200 is made of an electrically conductive material. Layer 205 has a surface 205', which then becomes surface 205' of the sub-mount. Then four electrodes 211-214 are coated onto the insulator 205 by metallization methods such as e-beam evaporator or sputtering. Thereafter, four recesses 201-204 are created in a sub-mount 200 by chemical etching or molding. FIG. 2B is a cross-sectional view of the sub-mount 200 of FIG. 2A, along the line 2B-2B in FIG. 2A. The opening of each recess has two-step size along the depth. The opening in the top portion is slightly larger than that in the bottom portion.

Figure 3A:
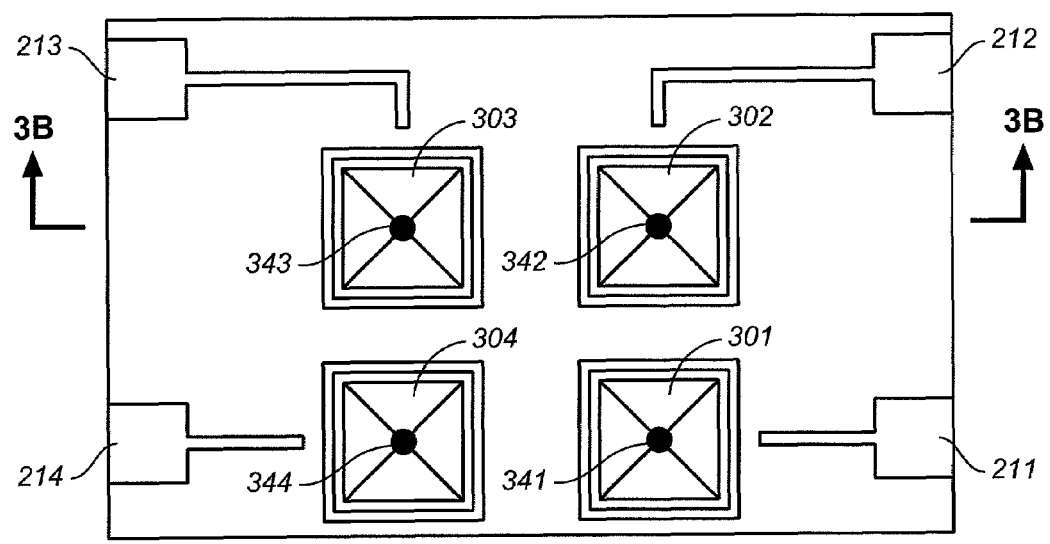
FIG. 3A is a top view of LED chips placed in the sub-mount of FIGS. 2A and 2B for LED chips useful for illustrating an embodiment of the invention.
Figure 3B:
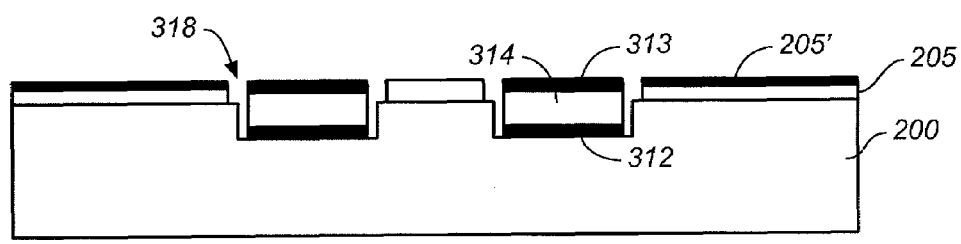
FIG. 3B is a cross-sectional view of the LED chips and sub-mount of FIG. 3A along the line 3B-3B in FIG. 3A.

Chips 301-304 are placed into the recesses 201-204, respectively, and secured by solder, metal bond or silver epoxy 312 as shown in FIGS. 3A and 3B. The chip 302 may for example be composed of thin epitaxial layer 313 on the substrate 314. Chips 301-304 might emit at different colors. Metal contact pads 341-344 as ohmic contact and current spreading are deposited on the epitaxial surfaces of chips 301-304, respectively. The surfaces of chips 301-304 are preferably leveled off to the surface 205' of the sub-mount 200. The openings of recesses are created to be slightly larger than the chip size such that gaps 318 (only one is shown for illustration purpose) is formed between the chips and the sub-mount 200. Insulator material 401 such as epoxy, silica gel are filled into the gap 318 as shown in FIG. 4B. The insulator 401 electrically insulates the epitaxial layers 313 from the electrically conductive sub-mount 200. Four chips are used in FIGS. 3A, 3B, 4A and 4B for illustrating the present invention. Embodiments with more or fewer than four chips in a module are also within the scope of the present invention.

Figure 4A:
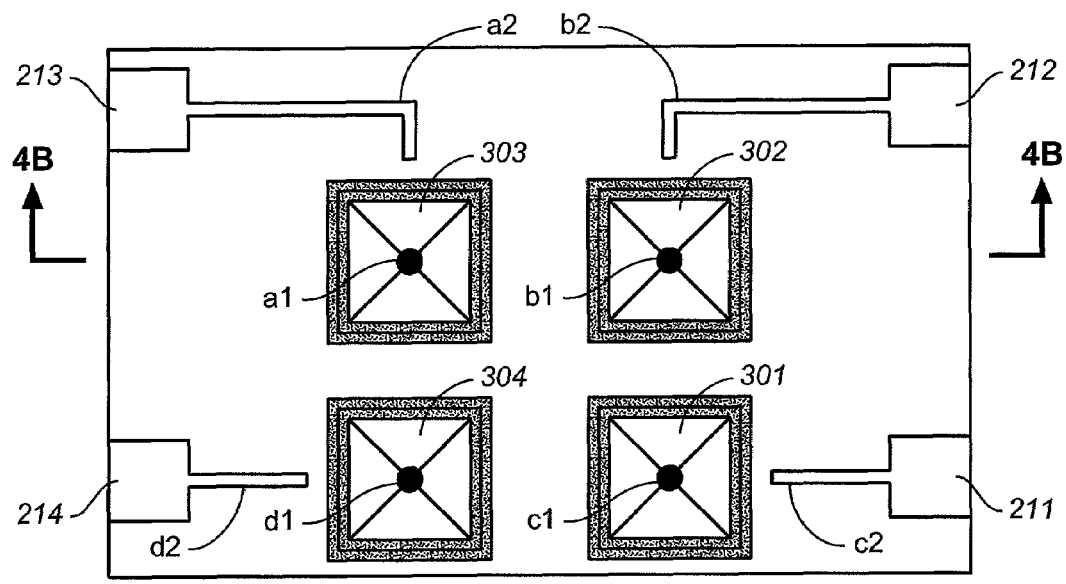
FIG. 4A is a top view of LED chips in a sub-mount of FIGS. 3A and 3B for LED chips where gaps between the edges of a chip and the sub-mount are filled with an insulating material to electrically isolate the epitaxial layers in the chips from the sub-mount to illustrate an embodiment of the invention.
Figure 4B:
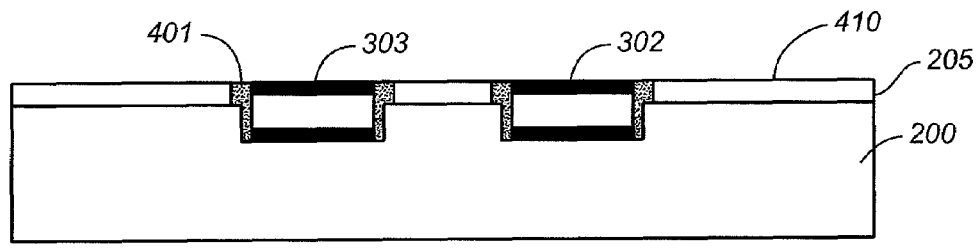
FIG. 4B is a cross-sectional view of the LED chips, sub-mount and insulator material of FIG. 4A along the line 4B-4B in FIG. 4A.
Figure 5A:
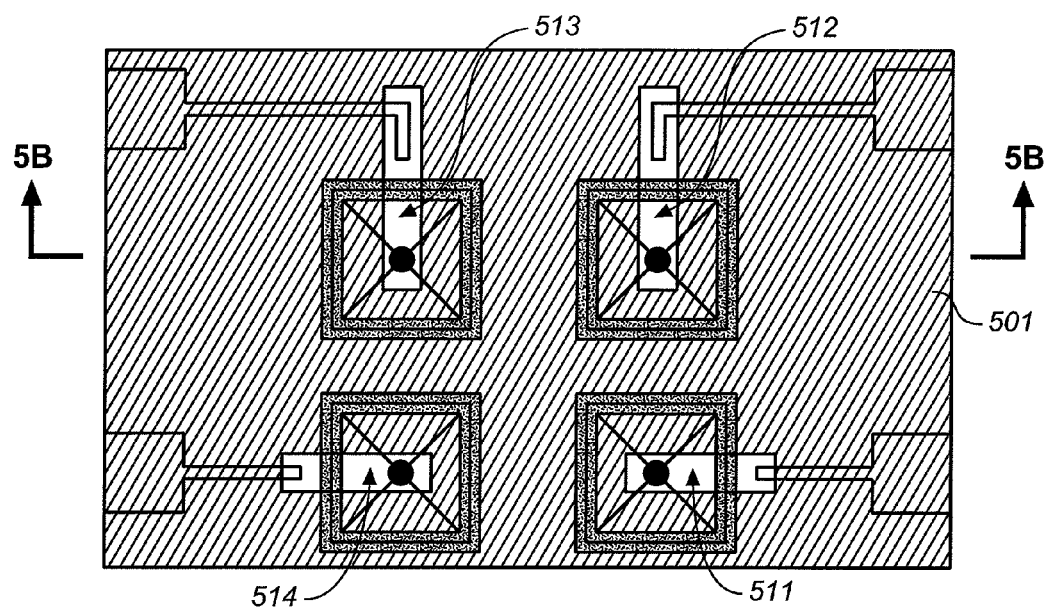
FIG. 5A is a top view of LED chips in a sub-mount for LED chips of FIGS. 4A and 4B where a photo-resist is applied to the surface of the sub-mount and where openings are formed therein for electrical connection, to illustrate an embodiment of the invention.
Figure 5B:
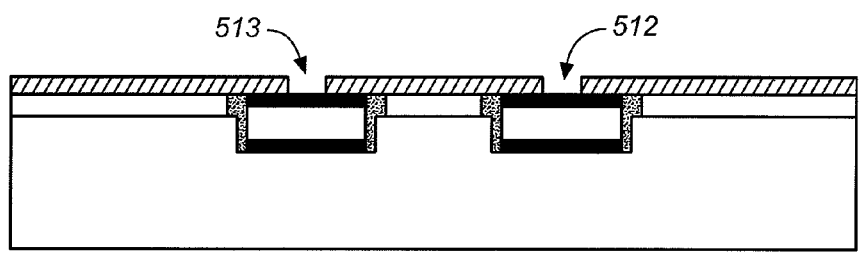
FIG. 5B is a cross-sectional view of the LED chips, sub-mount, insulator material and photo-resist of FIG. 5A along the line 5B-5B in FIG. 5A.
Figure 6A:
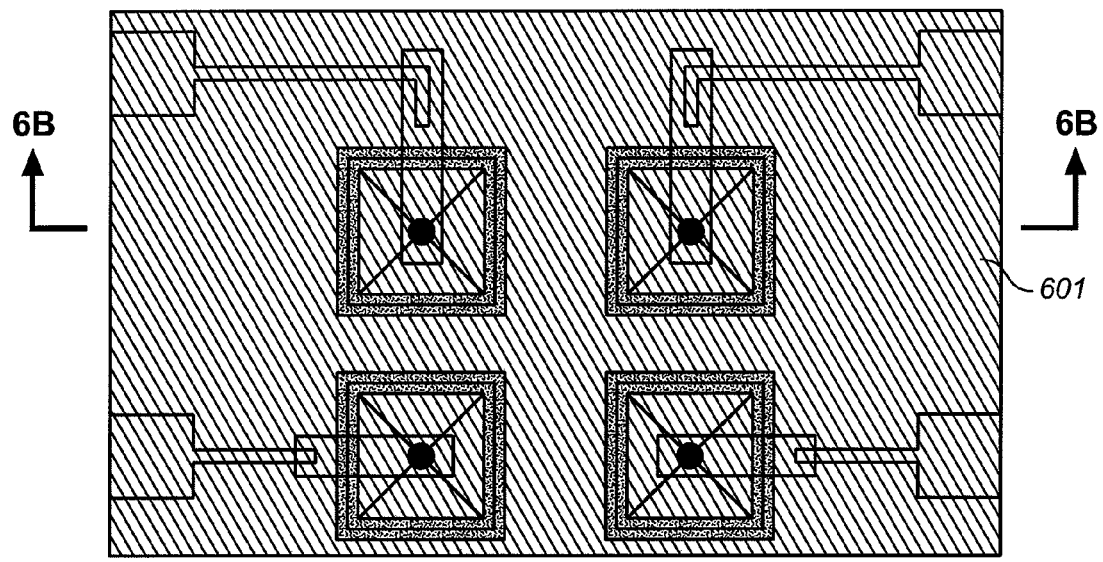
FIG. 6A is a top view of LED chips in a sub-mount for LED chips of FIGS. 5A and 5B, where a conductive layer is deposited thereon to illustrate an embodiment of the invention.
Figure 6B:
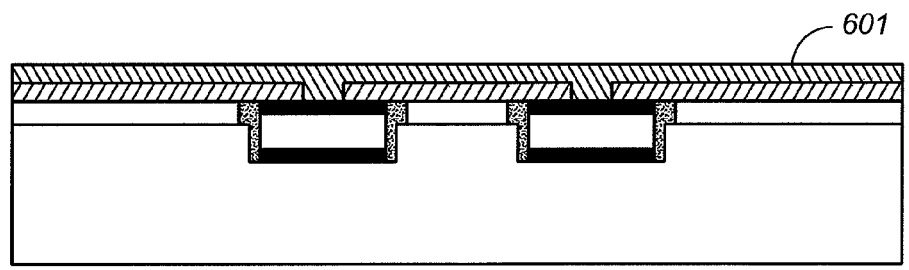
FIG. 6B is a cross-sectional view of the LED chips, sub-mount, insulator material and photo-resist of FIG. 6A along the line 6B-6B in FIG. 6A.
Figure 7A:
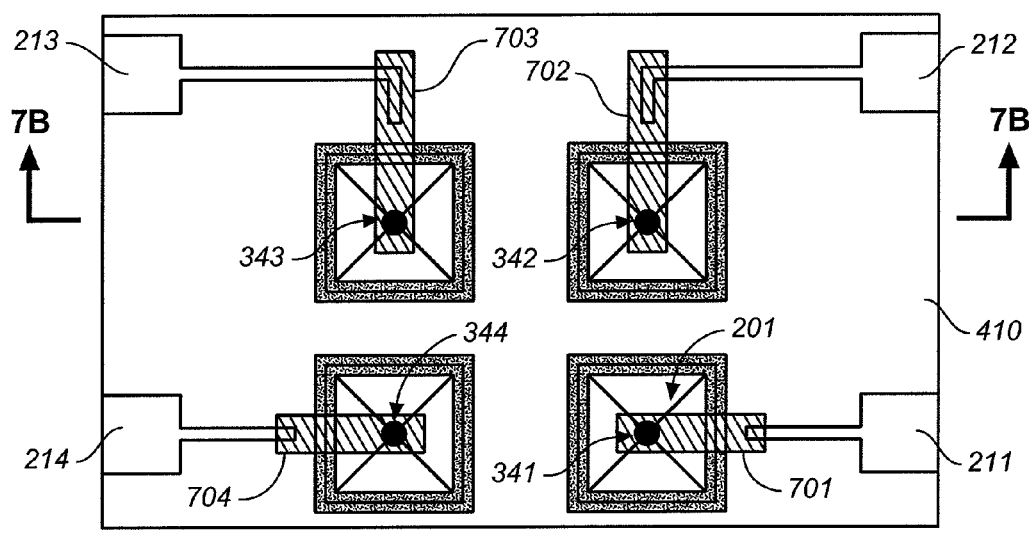
FIG. 7A is a top view of LED chips in a sub-mount of FIGS. 6A and 6B, where the photo-resist layer of FIGS. 6A, 6B have been removed together, with the conductive layer on top of the photo-resist having been lift-off to illustrate an embodiment of the invention.
Figure 7B:
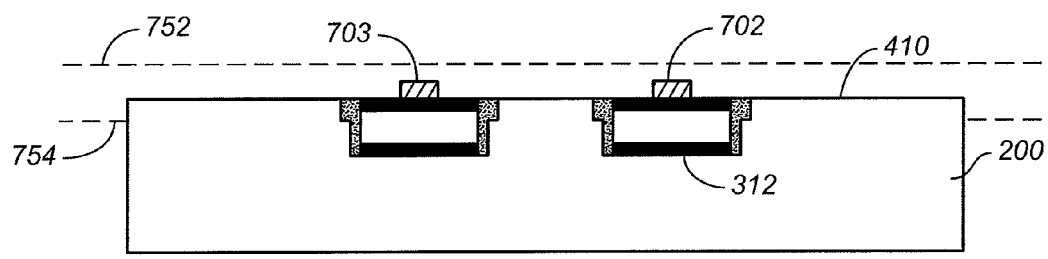
FIG. 7B is a cross-sectional view of the assembly of FIG. 7A along the line 7B-7B in FIG. 7A.

Photo-resist layer 501 or its equivalent illustrated in FIG. 5A is then coated onto the full surface 205' of the sub-mount 200 including surfaces of chips 301-304 shown in FIG. 4B. The surface 205' together with the surfaces of chips 301-304 are referred to as surface 410. The standard photo-lithographic technique is used to remove some photo-resist material from the photo-resist layer 501 in order to expose areas of the chips 301-304, including surfaces of contact pads 341-344 to create open strips 511-514. Direct screen printing technique can be used as well to print patterns, like one having opening strips in a surface shown in FIG. 5A, to the surface 410. Thereafter, conductive transparent materials such as Indium Tin Oxide (ITO) or metals such as gold or aluminum are deposited into the opening strips 511-514 as well as to the photo-resist surface 501 as shown by 601 in FIGS. 6A and 61B. The photoresist 501 is then removed by solvents and the conductive material 601 on the top of the photo-resist is therefore lift off. After the lift off, only conductive material deposited into the open strips 501-504 remains as shown by bridges 701-704 in FIGS. 7A and 7B. The bridge 701 electrically interconnects metal pad 341 and electrode 211. The bridge 702 electrically interconnects metal pad 342 and electrode 212. The bridge 703 electrically interconnects metal pad for 343 and electrode 213. The bridge 704 electrically interconnects metal pad 344 and electrode 214.

In the present invention, all interconnections 701-704 are made simultaneously. The individual wire bonding is thus avoided. The electrical interconnections 701-704 are laid on a surface 410, which includes the surfaces of chips 301-304 leveled off to the top surface of the sub-mount 200. Therefore, there is no wire protrusion and the interconnections are therefore more reliable. Taking electrode 211 for example, current flows from it via bridge 701, enters chip 201 via metal pad 341, and then pass to the sub-mount 200.

By supporting the interconnect 701-704 on a carrier such as the sub-mount 200 and on the LED chip contact pads and electrodes 211-214 (which in turn are supported by sub-mount 200) along a majority of their lengths, instead of only at both ends thereof, the above described problem of conventional designs with wire bond interconnections between the LED chips and electrodes causing reliability problems is avoided. Thus, even if a portion of each of the interconnect 701-704 is not supported directly by a carrier or indirectly through components (e.g. LED chip contacts and electrodes) that are supported by the carrier, as long as a substantially part of such interconnect, such as more than half of the interconnect is so supported, the design is still more reliable compared to conventional designs where the interconnect are supported only at both ends, as in the case of wire bonding.

It will be noted that the contact pads 341-344 of the LED chips have been leveled off to the top surface 205' of the sub-mount 200 so that the assembly of the sub-mount and LED chips has a substantially planar surface 410. Sitting on top of surface 410, the interconnect 701-704 is substantially in or slightly above or below the plane of the surface 410 of the LED chip and sub-mount assembly. The electrodes 211-214 are either substantially in or slightly above or below the plane of the chip and sub-mount assembly surface 410, and portions of the interconnect 701-704 are sitting on top of the electrodes 211-214. Thus, contact pads 341-344 of the LED chips, interconnect 701-704 and electrodes 211-214 are substantially in or near the same plane, which is the plane of surface 410, or slightly above or below it. This restriction may be relaxed somewhat if desired, to accommodate different module designs, so that these three components (pads 341-344, interconnect 701-704, electrodes 211-214) may be at some what different elevations from surface 410, such as where the three components are on or slightly above or below surface 410 and do not extend more than 400 microns from surface 410. Where one or more of the three components may be below the surface 410, this relaxed restriction becomes where these three components do not extend beyond two parallel reference planes that are 400 microns apart. These two imaginary reference planes are illustrated by two dotted lines 752 and 754 in FIG. 7B.

Figure 8A:
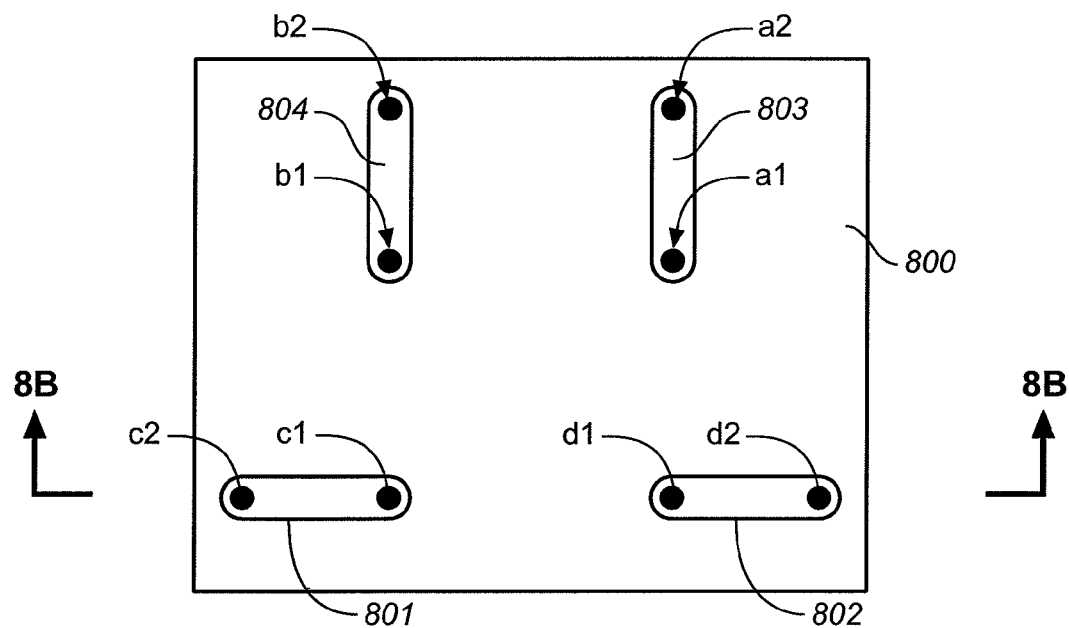
FIG. 8A is a top view of a sub-assembly comprising a transparent sheet with an electrically conductive material thereon for interconnecting the LED chips in FIGS. 4A and 4B to show another method for creating interconnection among chip array to illustrate another embodiment of the invention.
Figure 8B:
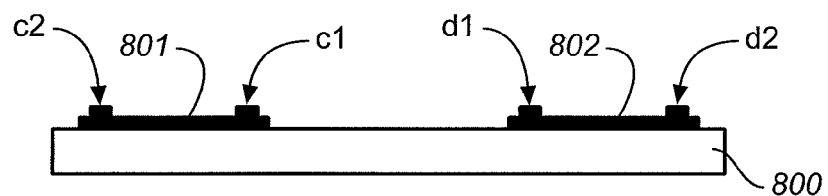
FIG. 8B is a cross-sectional view of the sub-assembly of FIG. 8A along the line 8B-8B in FIG. 8A.

FIG. 8A is a top view of a sub-assembly comprising a transparent sheet with an electrically conductive material thereon for interconnecting the LED chips in FIGS. 4A and 4B to show another method for creating interconnection among chip array to illustrate another embodiment of the invention. FIG. 8B is a cross-sectional view of the sub-assembly of FIG. 8A along the line 8B-8B in FIG. 8A.

A transparent sheet 800 such as glass is patterned with metal strips 801-804. Solder balls c1 and c2 are formed on or attached to the strip 801 near its two ends. The same is applied to other three strips 802-804, such as solder balls d1 and d2 formed on or attached to the strip 802 near its two ends. The glass sheet 800 is flipped over and mounted directly to the chip assembly shown in FIGS. 4A and 4B. The solder balls at both ends of a corresponding strip are aligned with the metal contact pad of the corresponding chip and the corresponding electrode. For example, solder ball c1 is aligned with contact pad 341 and solder ball c2 is aligned with electrode 211; solder ball d1 is aligned with contact pad 344 and solder ball d2 is aligned with electrode 214, as partly illustrated in FIG. 4A. Pressure and heat are applied to the solder balls to melt them in order to attach and electrically connect one of the strips 801-804 to its corresponding metal contact pad of the corresponding chip and the corresponding electrode, resulting in a structure shown in FIGS. 9A and 9B. The solder balls can also be replaced by conductive adhesive such as silver epoxy.

Figure 9A:
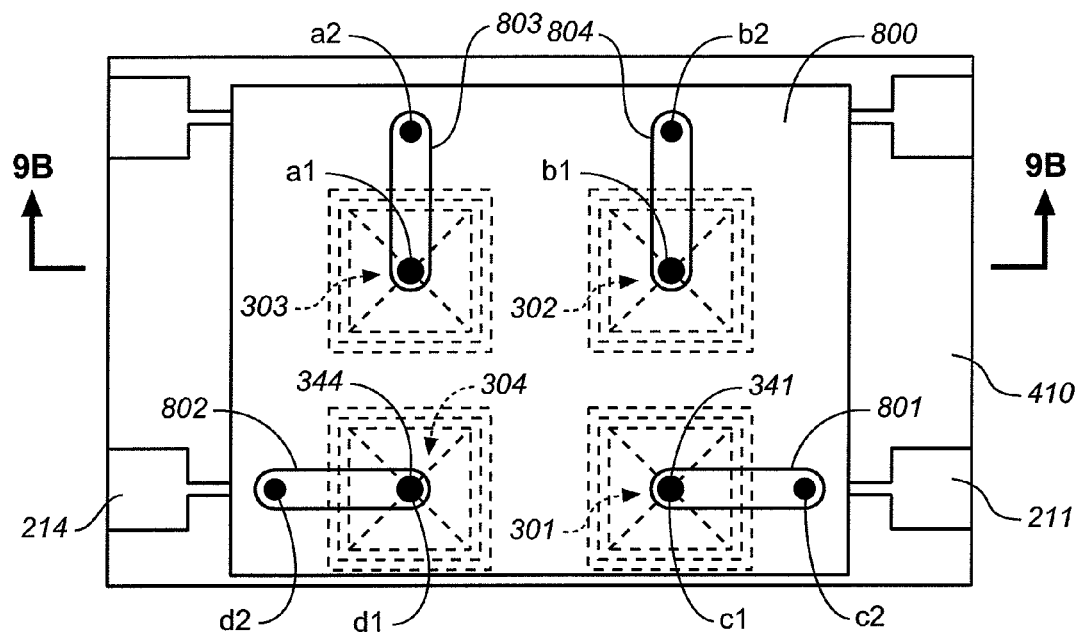
FIG. 9A is a top view of an LED chip array in a sub-mount of the type in FIGS. 4A and 4B where the chips are interconnected by means of the sub-assembly of FIGS. 8A and 8B.
Figure 9B:
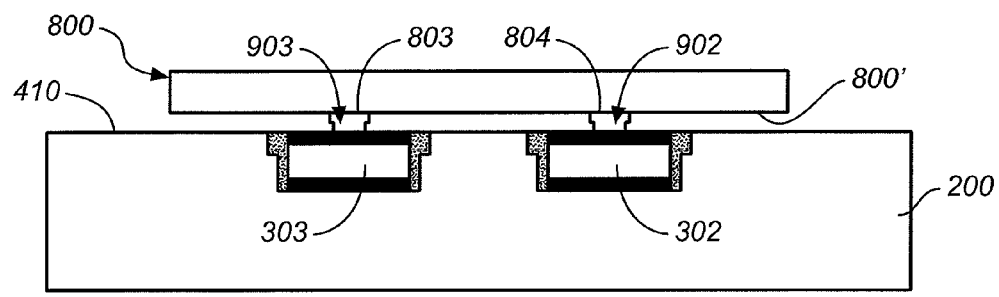
FIG. 9B is a cross-sectional view of the sub-assembly of FIG. 9A along the line 9B-9B in FIG. 9A.

FIG. 9A is a top view of an LED chip array in a sub-mount of the type in FIGS. 4A and 4B where the chips are interconnected to electrodes by means of the sub-assembly of FIGS. 8A and 8B. FIG. 9B is a cross-sectional view of the sub-assembly of FIG. 9A along the line 9B-9B in FIG. 9A. As shown in FIG. 9B, 902 and 903 are the solder or adhesive interconnections between the metal contact pads of the LED chips 302 and 303 to metal strips 804 and 803 respectively on glass substrate 800. To reduce the Fresnel reflection, both sides of the transparent sheet 800 can be deposited with anti-reflective coating.

The embodiment of FIGS. 8A, 8B, 9A, 9B utilizes two carriers: the sub-mount 200 as one carrier, and sheet 800 as the second carrier. The LED chips and their contact pads are supported by one of the two carriers. The interconnect, in this case the metal strips 801-804, is supported by a different carrier, in this case the glass sheet 800. The electrodes may be supported by the sub-mount 200 as shown in FIGS. 9A, 9B. Alternatively, they may be supported by glass sheet 800 instead; such and other variations are within the scope of the invention. The contact pads of the LED chips are substantially in the plane of the sub-mount surface with recesses for housing the LED chips. The interconnect 801-804 are substantially in or slightly separated from the plane 800' of the glass sheet 800 facing the surface 410 of the LED chip and sub-mount assembly with recesses therein. The electrodes 211-214 are either substantially in or slightly separated from the plane of the sub-mount surface 410. Thus, in all such cases, as long as the surfaces 410 and 800' of the glass sheet 800 and that of the LED chip and sub-mount assembly facing one another are not more than a small distance apart (e.g. 400 microns), the total LED module is still compact. This is the case even where surfaces 410 and 800' are not parallel, although it is preferred that they be substantially parallel to one another.

By supporting the interconnect 801-804 on a carrier along a majority (i.e. over half) of their lengths, instead of only at both ends thereof, the above described problem of conventional designs with wire bond interconnections between the LED chips and electrodes causing reliability problems is avoided, although preferably, the interconnect is supported over its entire length. This is especially true for the embodiment of FIGS. 8A, 8B, 9A, 9B. By enclosing the interconnect 801-804 between the glass sheet and the sub-mount, the interconnect is protected from the environment, so that reliability is improved.

Figure 11A:
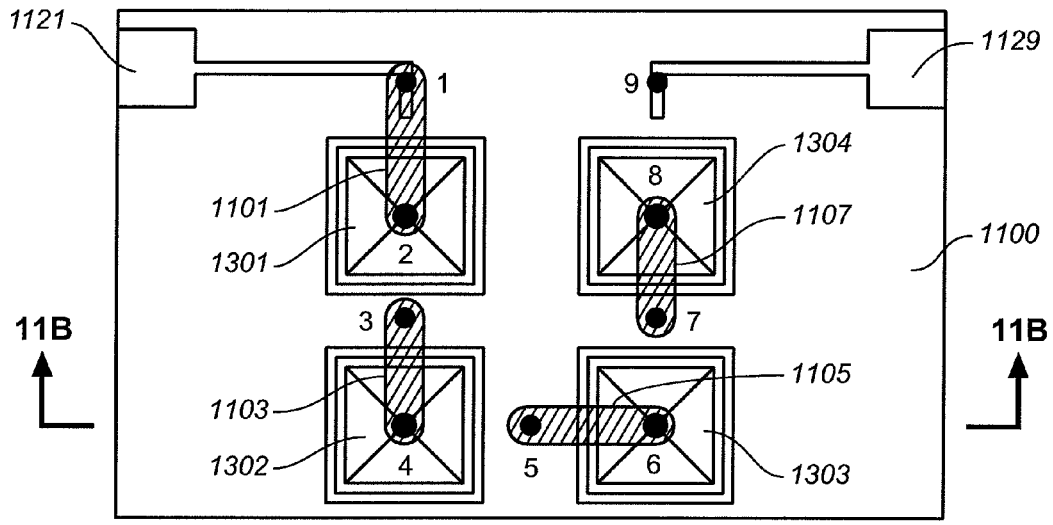
FIG. 11A is a top view of LED chips in a sub-mount, with insulating material in gaps between the chips and the sub-mount, similar to the module of FIGS. 4A and 4B, where the chips are connected electrically in series to illustrate another embodiment of the invention.
Figure 11B:
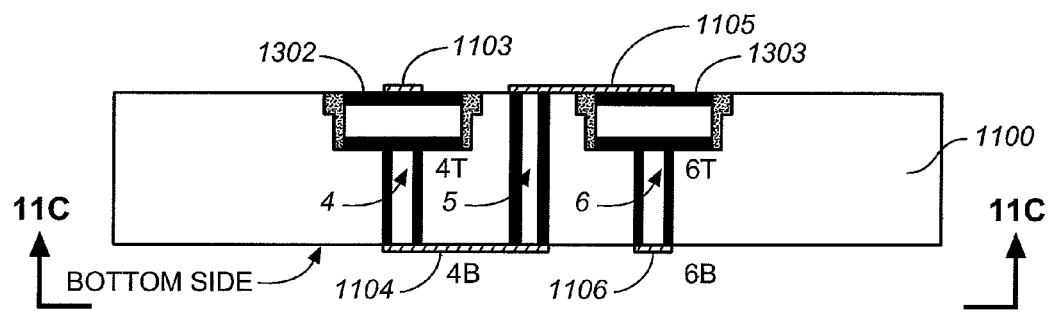
FIG. 11B is cross-sectional view of the assembly of FIG. 11A along the line 11B-11B in FIG. 11A.
Figure 11C:
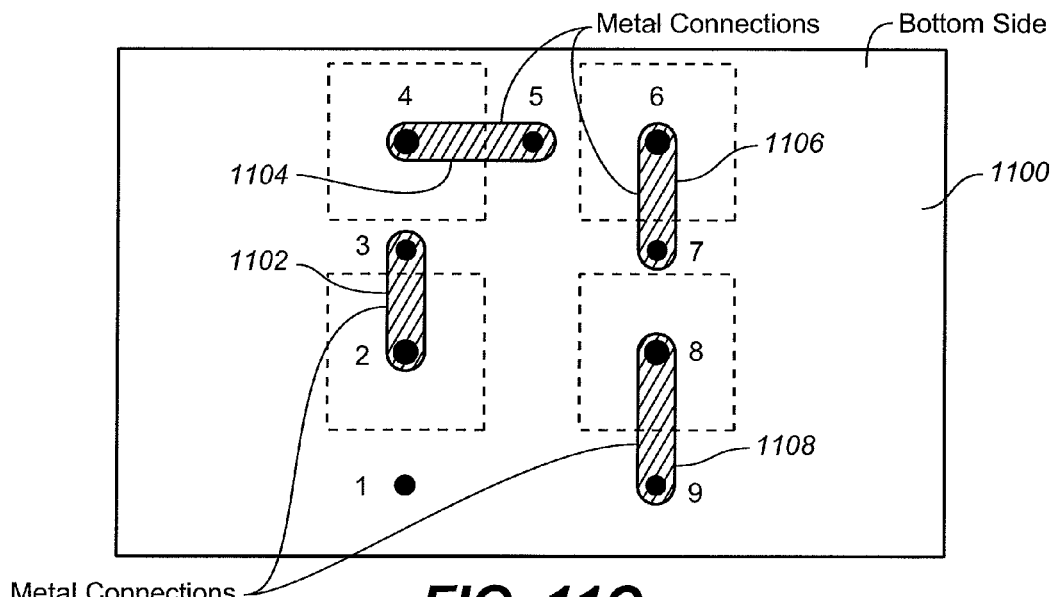
FIG. 11C is the bottom view of the chip assembly of FIGS. 11A and 11B along the line 11C-11C in FIG. 11B to illustrate the electrical connections on the back side of the sub-mount of the chip assembly of FIG. 11A.

In some applications, chips may need to be connected electrically in series in an electrical circuit. FIGS. 11A, 11B and 11C show how four chips are interconnected by flat electrically conductive strips or bridges of the type described in reference to FIGS. 2 to 9. Flat strips are patterned on both sides or opposite surfaces of the sub-mount 1100, which is made of an electrically non-conductive but thermally conductive material such as ceramic. Through holes 2 to 9 are formed in sub-mount 1100 between its opposite surfaces to create electrically conductive paths to conduct current between electrically conductive strips on opposite surfaces of the sub-mount 1100, or between electrically conductive strips on one surface of the sub-mount 1100 and an LED chip. The interiors of through holes 2 to 9 are plated with conductive metals to form electrically conductive vias. Three out of eight through holes (4, 5 and 6) are shown in the cross-sectional view FIG. 11B. The current flow path is as follows: from electrode 1121, via strip or bridge 1101 to contact of chip 1301, via chip 1301, via through hole or vias 2, via bridge 1102 on the bottom surface of the sub-mount, via through hole or vias 3, via bridge 1103 to contact of chip 1302, via chip 1302, via through hole or vias 4, via bridge 1104, via through hole or vias 5, via bridge 1105 on the top surface of the sub-mount, via chip 1303, via through hole or vias 6, via bridge 1106 on the bottom surface of the sub-mount, via through hole or vias 7, via bridge 1107 on the top surface of the sub-mount, via chip 1304, via through hole or vias 8, via bridge 1108 on the bottom surface of the sub-mount, via through hole or vias 9 and reach electrode 1129.

In the prior art, the bonding wires protruding out of chips cause diffraction as the light emitting from the chip strikes on the wire. The diffraction adversely affect light collimation and make color mixing more difficult when multiple chips of different colors are assembled closely to produce white light. In the present invention, bonding wires protruding out of the chips are avoided and therefore light collimation and color mixing are easier to perform.

Figure 12A:
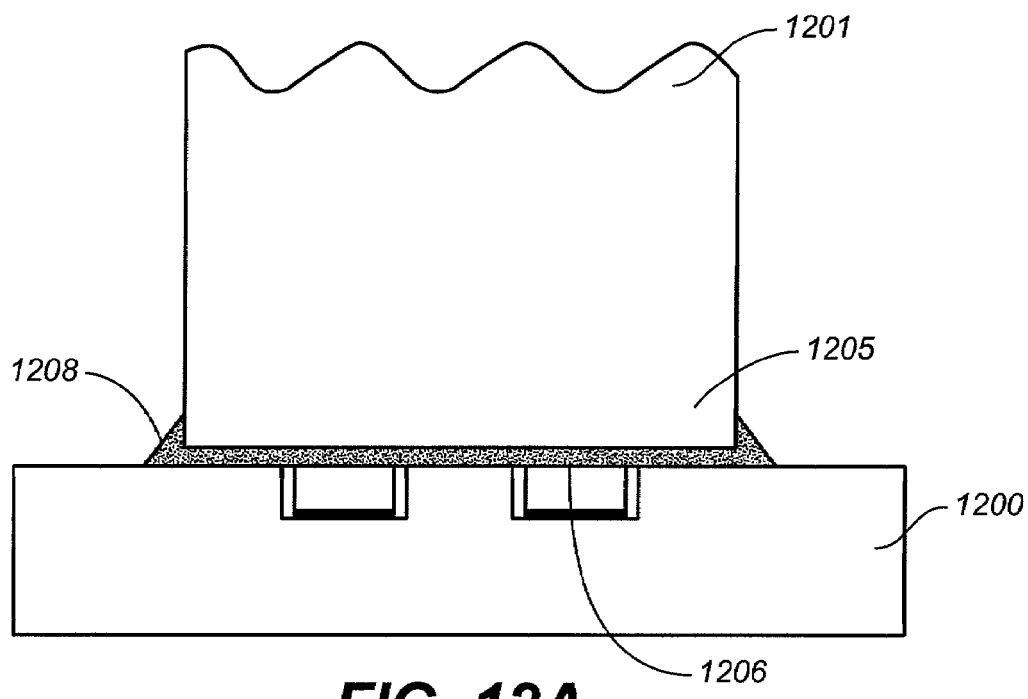
FIG. 12A is a side view of a module with multiple LED chips coupled to a portion of an optical fiber of the present invention to illustrate yet another embodiment of the invention.
Figure 12B:
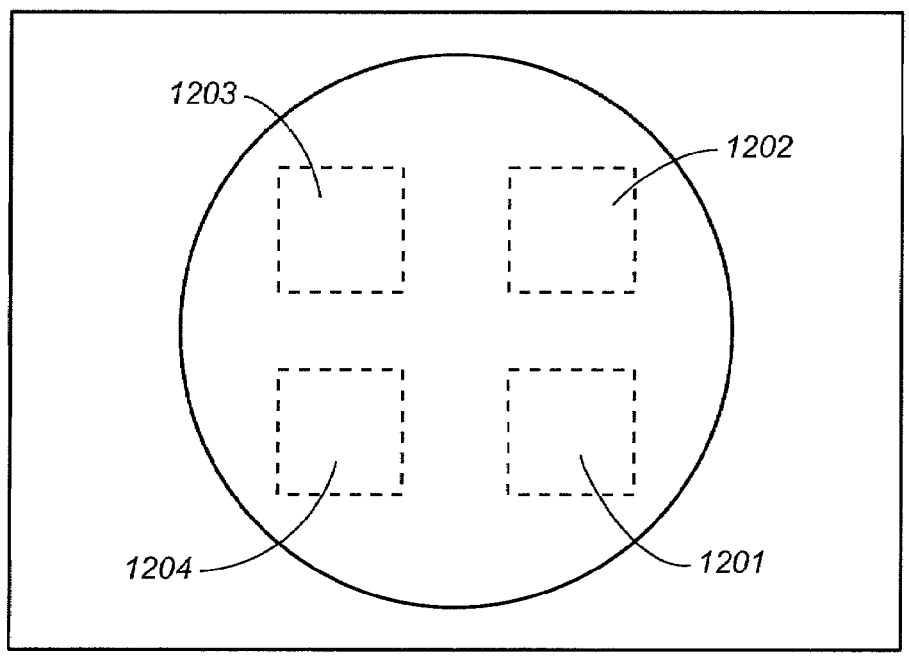
FIG. 12B is a top view of the fiber chip assembly of FIG. 12A.

Furthermore, owing to the elimination of bonding wires, the chip assembly in the present invention can be brought very closely to the external optical elements such as optical fiber, lens, and optical diffuser to enhance the coupling efficiency. FIGS. 12A and 12B show an LED chip module 1200 of the present invention is coupled to a optical fiber 1201. The module 1200 includes four LED chips 1201-1204 of same colors or different colors. The optical fiber 1201 is coupled to the four LED chips 1201-1204. The fiber end 1205 can be brought to the surfaces 1206 of the LED chips as closely as possible to increase the light coupling to the fiber 1201. The transparent epoxy or gel 1208 can be filled into the gap between the fiber end 1205 and the chip surface 1206 to reduce the Fresnel reflection at the optical interfaces and to protect the chips from surface damage and secure the fiber 1201 in place. FIG. 12B is the top view of FIG. 12A. The optical fiber 1201 in the embodiment can be replaced by an optical diffuser, which mixes colors emitting from chips 1201-1204.

While the invention has been described above by reference to various embodiments, it will be understood that changes and modifications may be made without departing from the scope of the invention, which is to be defined only by the appended claims and their equivalent. All references referred to herein are incorporated herein by reference.

What is claimed is:

1. An LED chip array module, comprising:
a plurality of LED chips, each chip having an electrical contact;
one or more carriers, wherein at least one of said carrier(s) supports said chips, and wherein at least one of said carrier(s) has a first surface;
a plurality of electrodes supported on said first surface;
an electrically conductive elongated first interconnect supported along a majority of its length by said first surface, said first interconnect being electrically insulated from said at least one of said carrier(s), said interconnect connecting the electrical contacts of said plurality of LED chips to said electrodes, wherein said electrical contacts, said first interconnect and said electrodes do not extend beyond two parallel reference planes that are 400 microns apart, wherein said LED chips, said one or more carriers, said plurality of electrodes and said first interconnect are elements distinct from one another.

2. The module of claim 1, wherein said at least one of said carrier(s) supporting said chips defines a plurality of recesses therein and has said first surface, each recess housing a corresponding one of said plurality of LED chips, so that said electrical contacts do not protrude beyond said first surface.

3. The module of claim 2, wherein said interconnect comprises a layer of electrically conductive material supported by and in contact with portions of the electrical contacts of the chips, the electrodes and the first surface.

4. The module of claim 3, wherein said at least one of said carrier(s) supports said chips and has said first surface, and said interconnect and said electrodes extend not more than about 400 microns from the first surface.

5. The module of claim 1, wherein said first interconnect connects the electrical contact of each of said plurality of LED chips to a corresponding one of said electrodes.

6. The module of claim 1, wherein said interconnect connects the chip in series to said electrodes.

7. The module of claim 6, wherein said at least one carrier has a second surface, said first interconnect comprising first electrically conductive strips supported on said first surface and said module further comprising a second interconnect which comprises second electrically conductive strips supported on said second surface.

8. The module of claim 7, said second interconnect including electrically conductive vias through said at least one carrier connecting two or more of the following: the first strips, the second strips and the electrical contacts of the chips.

9. The module of claim 8, wherein said at least one carrier defines through holes therein between the first and second surfaces, said vias comprising an electrically conductive material in said holes.

10. The module of claim 7, said first and second surfaces being on opposite sides of said at least one carrier.

11. An LED chip array module, comprising:
- a plurality of LED chips, each chip having an electrical contact;
- one or more carriers, wherein at least one of said carrier(s) supports said chips, and wherein at least one of said carrier(s) has a first surface;
- a plurality of electrodes supported on said first surface;
- an electrically conductive elongated interconnect supported at points along its length between endpoints by at least one of said carrier(s), said interconnect connecting the electrical contacts of said plurality of LED chips to said electrodes, said one or more carriers, said plurality of electrodes and said interconnect being separate elements distinct from one another, said interconnect connecting selective ones of said plurality of LED chips to one another.

* * * * *